United States Patent
Bando

(10) Patent No.: US 10,840,420 B2
(45) Date of Patent: Nov. 17, 2020

(54) METHOD FOR MANUFACTURING LIGHT EMITTING DEVICE

(71) Applicant: NICHIA CORPORATION, Anan (JP)

(72) Inventor: Yoichi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 408 days.

(21) Appl. No.: 15/337,318

(22) Filed: Oct. 28, 2016

(65) Prior Publication Data
US 2017/0125654 A1 May 4, 2017

(30) Foreign Application Priority Data

Oct. 30, 2015 (JP) .................................. 2015-215080
Sep. 23, 2016 (JP) .................................. 2016-185687

(51) Int. Cl.
*H01L 33/60* (2010.01)
*H01L 33/46* (2010.01)

(52) U.S. Cl.
CPC .............. *H01L 33/60* (2013.01); *H01L 33/46* (2013.01); *H01L 2933/0058* (2013.01)

(58) Field of Classification Search
CPC .......... H01L 33/60; H01L 2924/12041; H01L 33/24; H01L 33/504; H01L 33/54; H01L 2933/0058
See application file for complete search history.

(56) References Cited

U.S. PATENT DOCUMENTS

| 3,357,300 A * | 12/1967 | Cornell .................. G03B 21/00 353/22 |
| 9,755,114 B2 * | 9/2017 | Albrecht ................. H01L 24/97 |
| 2008/0128739 A1 * | 6/2008 | Sanpei ................. H05K 1/0203 257/99 |
| 2008/0194061 A1 * | 8/2008 | Medendorp ........... B29C 43/021 438/118 |
| 2011/0012160 A1 * | 1/2011 | Kitabayashi ............ H01L 33/22 257/98 |
| 2011/0062488 A1 * | 3/2011 | Uemura .................. H01L 33/38 257/103 |
| 2011/0220932 A1 * | 9/2011 | Katsuno ................ H01L 33/382 257/98 |
| 2011/0220939 A1 * | 9/2011 | Nakayama .............. H01L 33/44 257/98 |
| 2011/0240956 A1 * | 10/2011 | Saito ....................... H01L 33/02 257/13 |

(Continued)

FOREIGN PATENT DOCUMENTS

| JP | 2010-219324 A | 9/2010 |
| JP | 2011-134926 A | 7/2011 |

(Continued)

*Primary Examiner* — Charles D Garber
*Assistant Examiner* — S M Sohel Imtiaz
(74) *Attorney, Agent, or Firm* — Global IP Counselors, LLP

(57) ABSTRACT

A method for manufacturing a light emitting device, includes: providing a reflective film; providing a light emitting element having a semiconductor stacked layer and electrodes formed at a first main surface side of the light emitting element; pressing the reflective film on the first main surface side to deform the reflective film, and disposing the reflective film on at least a side surface of the light emitting element; and exposing the electrodes of the light emitting element from the reflective film.

15 Claims, 7 Drawing Sheets

(56) References Cited

U.S. PATENT DOCUMENTS

| | | | | |
|---|---|---|---|---|
| 2011/0309388 A1* | 12/2011 | Ito | .......................... | H01L 33/60 |
| | | | | 257/89 |
| 2012/0063150 A1* | 3/2012 | Takeuchi | .................. | G09F 9/33 |
| | | | | 362/308 |
| 2013/0313594 A1* | 11/2013 | Han | ........................ | H01L 33/44 |
| | | | | 257/98 |
| 2014/0179042 A1* | 6/2014 | Chen | ........................ | H01L 33/50 |
| | | | | 438/29 |
| 2014/0239318 A1* | 8/2014 | Oyu | ........................ | H01L 33/62 |
| | | | | 257/88 |
| 2015/0280066 A1* | 10/2015 | Fujimura | ................. | H01L 33/46 |
| | | | | 257/98 |
| 2016/0004147 A1* | 1/2016 | Hu | ........................ | G03B 21/204 |
| | | | | 362/84 |
| 2016/0056355 A1* | 2/2016 | Ooyabu | ................ | H01L 33/505 |
| | | | | 257/89 |
| 2016/0126422 A1* | 5/2016 | Jeon | ........................ | H01L 33/20 |
| | | | | 257/98 |
| 2016/0133788 A1* | 5/2016 | Kim | ........................ | H01L 33/20 |
| | | | | 257/98 |

FOREIGN PATENT DOCUMENTS

| | | |
|---|---|---|
| JP | 2012-227470 A | 11/2012 |
| JP | 2015-195294 A | 11/2015 |

* cited by examiner

METHOD FOR MANUFACTURING LIGHT EMITTING DEVICE

CROSS-REFERENCE TO RELATED APPLICATIONS

This application claims priority to Japanese Patent Applications No. 2015-215080 filed on Oct. 30, 2015 and No. 2016-185687 filed on Sep. 23, 2016. The entire disclosure of Japanese Patent Applications No. 2015-215080 and No. 2016-185687 is hereby incorporated herein by reference.

BACKGROUND

The present disclosure relates to a method for manufacturing a light emitting device.

Light emitting devices in which a light emitting diode, a laser diode, or another such light emitting element is installed as a light source have been used in recent years in various kinds of lighting and display devices. For example, a light emitting device such as this has been proposed which comprises a semiconductor light emitting element having a transparent insulated substrate and a semiconductor layer formed on the lower surface of the substrate, and connecting electrodes for making a connection with a mother board, and in which the wavelength of part of the light emitted from the semiconductor light emitting element is converted (see Japanese unexamined Patent Application JP2012-227470A). This semiconductor light emitting device further comprises a white reflecting member that covers the sides of the semiconductor light emitting element, a phosphor sheet that is disposed on the opposite side of the transparent insulated substrate from the semiconductor layer and covers the transparent insulated substrate and the white reflecting member, and an adhesive layer that bonds the phosphor sheet and the transparent insulated substrate together. The semiconductor light emitting element has projecting electrodes.

SUMMARY

Accordingly, an object of an embodiment of the present disclosure to provide a method for manufacturing a light emitting device with which the directionality of light emitted from the device is improved and the device can be made smaller and thinner, by a simple manufacturing method.

A method for manufacturing a light emitting device according to one embodiment of the present disclosure includes, providing a reflective film; providing at least one light emitting element having a semiconductor stacked layer and electrodes formed at a first main surface side of the light emitting element; pressing the reflective film on the first main surface side to deform the reflective film, and disposing the reflective film on at least a side surface of the light emitting element; and exposing the electrodes of the light emitting element from the reflective film.

DETAILED DESCRIPTION

Figure 1A:
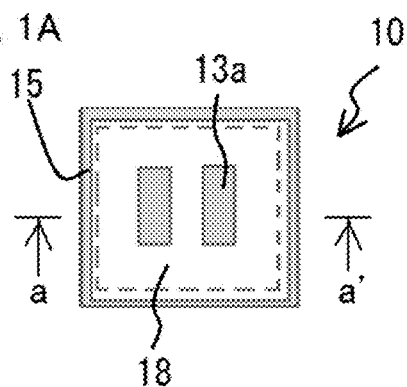
FIG. 1A is a schematic bottom view of the light emitting device according to an embodiment of the present disclosure.

Embodiments of the invention will now be described through reference to the drawings. However, the method of manufacturing the light emitting device described below is merely an embodiment of the technological concept disclosed herein, and unless otherwise specified, the present disclosure is not limited to or by what follows. Also, what is described in one embodiment or example can also be applied to other embodiments or examples.

The sizes, positional relations, and so forth of the members shown in the drawings may be exaggerated for the sake of illustration.

Figure 2A:
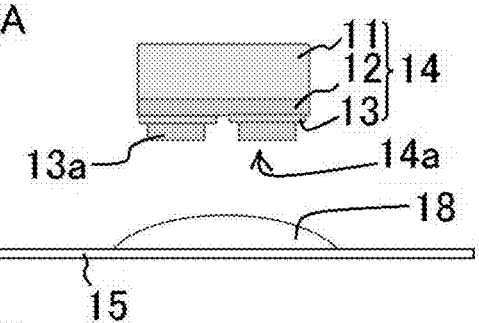
FIGS. 2A to 2F show the manufacturing steps involved in the method for manufacturing a light emitting device according to an embodiment of the present disclosure.
Figure 2B:
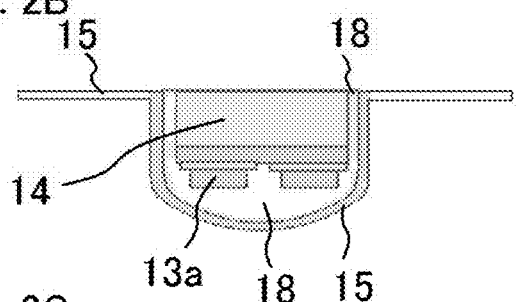
Figure 2C:
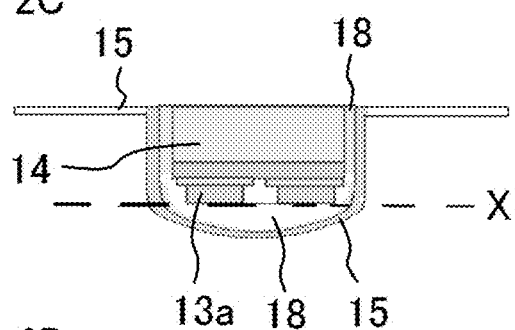

As shown in FIGS. 2A to 2E, embodiments of a method for manufacturing a light emitting device mainly include:

(a) providing a reflective film as shown in FIG. 2A;

(b) providing a light emitting element having a semiconductor stacked layer and electrodes formed on a first main surface side as shown in FIG. 2A;

(c) pressing the reflective film on the first main surface side of the light emitting element to deform the reflective film, and disposing the reflective film on at least a side surface of the light emitting element as shown in FIG. 2B; and (d) exposing the electrodes of the light emitting element from the reflective film as shown in FIG. 2C.

Figure 2D:
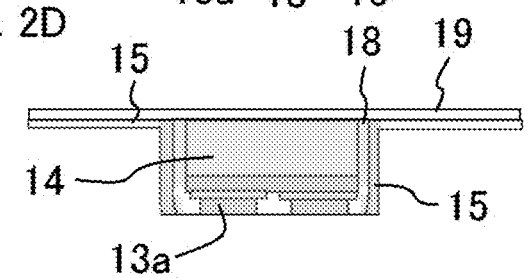
Figure 2E:
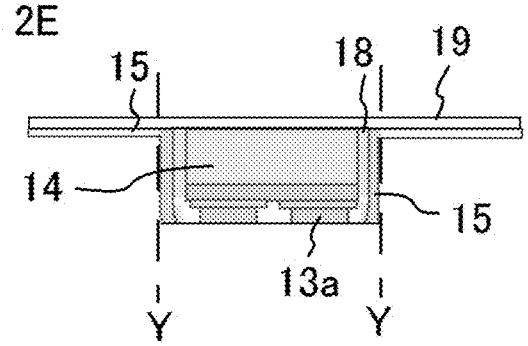

Further, this method may include:

(e) forming a light-transmissive member on a second main surface side of the light emitting element, which is on the opposite side from the first main surface as shown in FIG. 2D and/or (f) dividing up the reflective film into units including at least one of the light emitting elements as shown in FIG. 2E.

a: Providing Reflective Film 15

A reflective film 15 is provided. The term "reflective film" may refer to a film whose transmissivity of the light from the light emitting element being used is no more than 1%. This can reduce the amount of light that leaks out from the side surfaces of the light emitting device, and improves the directionality of the emission from the light emitting device. Also, this film is preferably made from a material whose reflectivity is at least 70%, more preferably at least 80%, and even more preferably at least 90%. This can improve the light extraction efficiency of the light emitting device.

More specifically, examples of reflective films include single-layer and laminate films made from Al, Ag, Au, Pt, Pd, Rh, Ni, W, Mo, Cr, Ti, Cu or other such metals or alloys of these, a dielectric containing an oxide or nitride (e.g., $SiO_2$, $Nb_2O_5$, $TiO_2$, $ZrO_2$, $Ta_2O_5$) of Si, Ti, Zr, Nb, Ta, Al or the like, or a ceramic (boron nitride, etc.). Of these, single-layer and laminate films made from aluminum, silver, copper, or other such metals or alloys containing these are preferable, and a single-layer film made from Al, Ag, or the like is more preferable. The reflective film may be one of the above-mentioned light reflecting materials provided over a substrate. Examples of substrates include resin films. Using a flexible substrate such as a resin film improves flexibility and strength to the reflective film. Also, in the step of deforming the reflective film by pressing as discussed below, there may be less risk of damage to the reflective film. Furthermore, using a material with good heat dissipation properties as the substrate can improve heat dissipation from the reflective film.

The thickness of the reflective film can be suitably adjusted according to the material being used, and is about 5 to 100 μm, for example, and preferably about 20 to 50 μm. The film thickness within this range reduces the risk of damage to the reflective film by pressing in a subsequent step. The size of the reflective film can be suitably adjusted according to the number of light emitting elements to be provided, as will be discussed below.

The reflective film can be formed by any method, ora commercially available product can be used. Using a reflective film such as this can simplify the manufacturing process.

The reflective film is preferably provided over a support member, for example. In other words, the reflective film is preferably such that the support member is on the bottom in the pressing step.

The support member is preferably formed from a material that has plastic, elastic, and/or flexible properties at least in the step of pressing the reflective film. Also, it is preferably formed from a material that can be deformed by pressing with a die-bonder or the like that is used in the field of semiconductors, and is more preferably formed from a material that can maintain this deformation. To put this another way, the support member is preferably such that a recess can be formed in the support member by pressing, and preferably such that the shape of the recess thus formed can be maintained. Alternatively, the support member may have a recess capable of accommodating a light emitting element is provided on the surface, or a recess having one or more stepped parts is provided, regardless of the material constituting the support member (see FIG. 7). This allows the reflective film to be deformed so as to conform to the shape of the recess, and can reduce manufacturing variance.

Examples of material of support members that exhibit such characteristics include clay, ceramics, metals, resins, or the like. The material of support members may be a material that can be used as a part of the light emitting device. In this case, the support member can constitute part of a light emitting device as a supporting component of the light emitting device, for example.

Figure 1B:
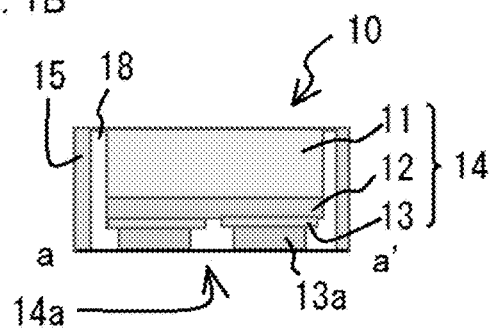
FIG. 1B is a schematic cross section along the a-a' line in FIG. 1A.
Figure 1D:
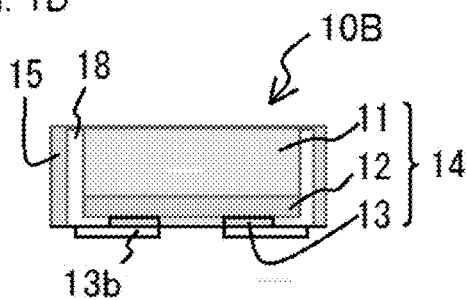
FIG. 1D is a schematic cross section of a modification example of FIG. 1B.
Figure 1C:
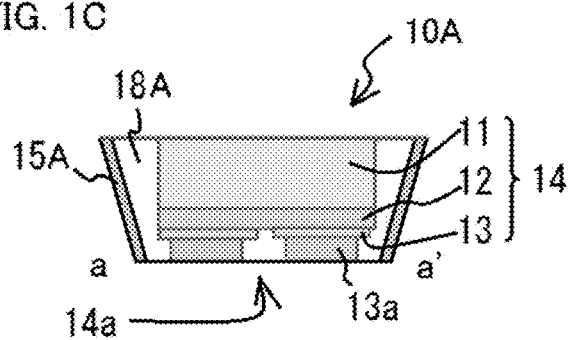
FIG. 1C is a schematic cross section of a modification example along the a-a' line in FIG. 1A.
Figure 1E:
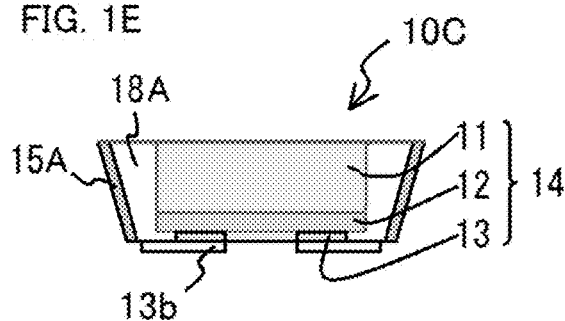
FIG. 1E is a schematic cross section of a modification example of FIG. 1C.

As shown in FIGS. 1B and 1D, the reflective film in a state of being provided to a light emitting device may have a surface that is substantially parallel to the side surfaces of the light emitting element, but as shown in FIGS. 1C and 1E, it preferably has a surface that is inclined so as to spread out in the direction of the second main surface of the light emitting element. This can improve light extraction from the side surfaces of the light emitting element, and improve the light extraction efficiency of the light emitting device.

b: Providing Light Emitting Element 14

A light emitting element 14 is provided. Just one light emitting element, or two or more can be prepared. The light emitting element can be any one that is used in this field.

For instance, the light emitting element has a semiconductor stacked layer and a pair of electrodes.

The semiconductor stacked layers may be formed of the nitride-based semiconductor. Examples thereof include a gallium nitride-based semiconductor material such as $In_XAl_YGa_{1-X-Y}N$ ($0 \leq X$, $0 \leq Y$, $X+Y \leq 1$). The semiconductor stacked layer being capable of emitting short wavelength visible light or ultraviolet light are preferable because of efficiently exciting fluorescent substance. Specifically, ones which emit the light of 240 to 560 nm, preferably 380 to 470 nm as the emission peak wavelength are preferable.

The semiconductor stacked layer preferably has a structure includes a first conductivity type (such as n-type) layer, an active layer, and a second conductivity type layer (such as p-type), in that order. The n- and p-type semiconductor layers may each be a single layer or have a multilayer structure. The active layer is preferably a multiple quantum well (MQW) structure.

The semiconductor stacked layer can be formed by stacking the above-mentioned layers over a growth substrate. Examples of this growth substrate include an insulated substrate such as C-plane, R-plane, and A-plane sapphire, and conductive substrates made of a semiconductor such as silicon carbide, silicon, ZnO, GaN, or AlN.

The growth substrate may be removed from the semiconductor stacked layer after the growth of the semiconductor stacked layer. Furthermore, the semiconductor stacked layer can be bonded to a support substrate, such as a conductive substrate or another light-transmissive member or substrate.

The electrodes preferably have a same-side electrode structure in which both electrodes the first conductivity type side and the second conductivity type side are provided on the same surface side of the light emitting element. The electrodes may have a conductive layer on their surface in order to impart thickness, for example.

In FIGS. 2A to 2F, the light emitting element 14 has a same-side electrode structure, and the electrodes 13 each have an electrode post 13a. The electrode posts 13a are a part of the electrodes 13 of the light emitting element 14, and are a portion that projects beyond the portion constituting the light emitting element 14 and the other portion of the electrodes 13. Providing these electrode posts may reduce the risk of damage to the light emitting element or the electrodes during removal in the step of exposing the electrodes of the light emitting element from the reflective film discussed below, and allows the reflective film to be removed more easily.

The light emitting element may have a light reflecting structure in its interior. For example, the light emitting element has two main surfaces of the semiconductor stacked layer that are opposite each other, one of the main surface opposite the light extraction side (that is, emission surface side) serves as the light reflecting side, and a light reflecting structure can be provided within the semiconductor stacked layer near the light reflecting side or provided to the electrodes, etc. Examples of a light reflecting structure include a structure in which a multilayer film reflecting layer is provided within the semiconductor layer, and a structure in which a reflecting layer, electrodes having a dielectric multilayer film, and a metal film such as Al or Ag that is highly reflective of light is provided over the semiconductor layer.

An insulating protective member made of a resin or the like may be provided on the side of the light emitting element with the pair of electrodes in order to reduce the risk of contact between the electrodes and the reflective film, light leakage from the light emitting device, or the like, or to allow the steps discussed below to be carried out more reliably. It is particularly favorable for the protective member to cover the outer peripheral portion of the light emitting element from the outer periphery of the electrodes. This can reduce the risk that light will leak out from the electrode side of the light emitting element, and the risk that the electrodes and the reflective film will come into contact and cause a short circuit or the like. The protective member may be made from a light-transmissive material, but preferably is reflective of light because it contains a light reflecting material, etc. The adhesive agent discussed below may also be replaced by this protective member.

The material of the resin of this protective member can be selected from among the light-transmissive materials discussed below. Examples of the light reflective material include titanium dioxide, silicon dioxide, zirconium dioxide, potassium titanate and zinc oxide. In the case where the titanium dioxide is used, the light reflecting material is preferably contained in an amount of 10 to 90 wt % with respect to the total weight of the resin and the material of the light reflecting material, and when light reflectivity is taken into account, the light reflecting material is preferably contained in an amount of at least 40 wt %, and when moldability is taken into account, the amount is preferably no more than 70 wt %. The protective member is preferably from a material whose transmissivity is at most 30%, more preferably at most 10%, and even more preferably at most 1%, and whose reflectivity is at least 70%, more preferably at least 80%, and even more preferably at least 90%.

c: Disposition of Reflective Film 15 on Light Emitting Element 14

The first main surface of the light emitting element is brought opposite the reflective film and pressed toward the reflective film from the second surface side of the light emitting element. This pressing deforms the reflective film, the reflective film conforms to the first main surface and the side surfaces of the light emitting element, and the reflective film is disposed on the first main surface and side surfaces of the light emitting element. In this case, as long as the reflective film conforms to the side surfaces of the light emitting element, the reflective film may be broken so that all or part of the first main surface of the light emitting element is exposed from the reflective film. Furthermore, a part of all of the side surfaces and/or some of the side surfaces of the light emitting element may be covered, but it is preferable for the reflective film to conform so that the covered side surfaces of the light emitting element are all of the side surfaces in their entirety.

An adhesive agent 18 is preferably disposed on the reflective film opposite the first main surface of the light emitting element prior to the pressing. The adhesive agent may be any one that is light-transmissive at least after curing, or may be one that contains titanium dioxide or another such light reflecting material and has a light reflecting property. In the case where a material that is light-transmissive is used as the adhesive agent, the light emitted from the light emitting element can be suitably reflected by the reflective film. Also, in the case where the adhesive agent contains a light reflecting material, this will support the reflection or blocking of light by the reflective film.

The side surfaces of the light emitting element may be coated with an adhesive agent. The result of thus disposing the adhesive agent is that the pressing of the light emitting element to the reflective film may dispose the adhesive agent on the side surfaces and the first main surface of the light emitting element.

The materials of the adhesive agent can be used ones whose transmissivity of the light emitted from the light active layer is at least 60%, more preferably at least 70%, 80% or 90%, or light blocking ratio of the light emitted from the light active layer is at least 70%, more preferably at least 80% or 90%. Examples of the material of the adhesive agent include silicone resin, silicone-modified resin, epoxy resin, phenol resin, polycarbonate resin, acrylic resin, TPX resin, polynorbornene resin, a hybrid resin containing one or more thereof and other such resins, glass, and other such light-transmissive materials, and the product of adding the above-mentioned light reflecting materials to such light-transmissive materials.

The adhesive agent may contain a phosphor. Examples of phosphors include cerium-activated yttrium.aluminum.garnet (YAG) phosphor, cerium-activated lutetium.aluminum..garnet (LAG) phosphor, europium- and/or chromium-activated nitrogen-containing calcium aluminosilicate ($CaO$—$Al_2O_3$—$SiO_2$) phosphor, europium-activated silicates (($Sr$, $Ba)_2SiO_4$) phosphor, β sialon phosphor, nitride phosphor such as CASN phosphors represented by $CaAlSiN_3$ that are activated by europium or SCASN phosphors represented by $(Sr,Ca)AlSiN_3$:Eu, KSF ($K_2SiF_6$:Mn) phosphor, and sulfide phosphors. These may be used singly or in combinations of two or more. The phosphor preferably has a mean particle size of no more than 30 μm, for example. The mean particle size can be measured and calculated with a commercially available particle size measurement device, particle size distribution measurement device, etc. Also, the phosphor may be a light emitting substance known as a quantum dot.

The adhesive agent may contain a filler. Examples of fillers include silicon oxide, titanium dioxide, zirconium oxide, magnesium oxide, crystallized or sintered phosphor, and a sinter of a phosphor and an inorganic binder.

The phosphor and/or filler is preferably contained in an amount of about 10 to 80 wt % with respect to the total weight of the light-transmissive material, for example.

The reflective film may be deformed ahead of time, prior to the pressing. More specifically, a recess corresponding to the planar shape of the light emitting element may be provided. The above-mentioned support member may be used for this purpose. For instance, the reflective film can be placed on a support member equipped with a recess corresponding to the planar shape of the light emitting element, after which it is allowed to stand and deform under the force of gravity, or a force can be applied to make the reflective film conform to the surface of the support member.

Also, the reflective film may be formed on a support member by sputtering, plating, or another such method. Furthermore, a reflective film in a shape that conforms can be formed on the first main surface to the side surfaces of the light emitting element by forming the reflective film by sputtering, plating, or another such method on a support member equipped with a recess corresponding to the planar shape of the light emitting element.

The pressing of the light emitting element here is preferably performed so that the pressure is exerted uniformly over the second main surface of the light emitting element. For instance, a die-bonder or other semiconductor manufacturing device can be employed. The amount of pressure can be suitably adjusted according to the size of the light emitting element, the material and thickness of the reflective film, the presence or absence of a support member, and so forth.

In the pressing, a second support member 49 shown in FIG. 6 that supports the light emitting element may be disposed on the second main surface side of the light emitting element, which is on the opposite side of the first main surface. Examples of a second support member include a sheet- or plate-form member that is resistant to heat and can function as a wavelength converter, etc. Heat and stress can be buffered by disposing a heat-resistant sheet or plate, and this allow avoids damage to the light emitting element. In the case that a wavelength conversion sheet or plate is disposed and the wavelength conversion sheet or plate is not removed in a subsequent step, it can be utilized as a wavelength conversion member of the light emitting device on the second main surface side of the light emitting element, The second support member preferably has enough adhesiveness to be able to maintain the position of the light emitting element. The heat resistant sheet may be any one that is used as a protective tape or a protective sheet in dicing or the like in a semiconductor process. The wavelength conversion sheet can be any one that is obtained by adding a phosphor and, if needed, a filler such as a diffusion agent or the like to the above-mentioned light-transmissive material, and can be used as a member of the light emitting device that is manufactured.

For instance, in the case that a plurality of light emitting elements are provided, they are preferably arranged spaced apart from each other on the second support member. This allows all of the light emitting elements to be pressed to the reflective film at once, which can improve manufacturing efficiency.

d: Exposure of Electrodes 13 of Light Emitting Element 14 from Reflective Film 15

Next, the electrodes 13 of the light emitting element 14 are exposed from the reflective film 15. The reflective film is preferably removed from the side where the reflective film is disposed.

In the case that a support member is used to support the reflective film, the support member can be a support component that is part of the light emitting device, and the reflective film and the support member are preferably removed from a side of the support member that is opposite to the surface the light emitting element is pressed.

In the embodiment shown in FIG. 2, of the electrodes 13 of the light emitting element 14, the reflective film is removed so that the electrode posts 13a are exposed.

The removal of these can be accomplished by blasting, cutting, grinding, or the like. The blasting may entail either air blasting or wet blasting, for example. The medium used in the blasting can be metal particles, alumina, silicon carbide, or other such ceramic microparticles, nylon, polycarbonate, or another such resin, glass powder, natural or synthetic diamond, or the like. The specific conditions, such as the blasting speed, blasting angle, blasting quantity, and so forth, can be suitably adjusted according to the type of medium (particle size, composition, density, hardness, and strength) and so forth.

The device used for grinding can be, for example, a grinding wheel formed from a material that is harder than the reflective film and the support substrate. The rotation of the whetstone and the stage may be in the same direction or opposite directions. More specifically, the wheel can be one in which a material (in the form of particles, crushed material, etc.) that is harder than the substrate has been solidified with a resin or the like. Examples include alumina, silicon carbide, and natural or synthetic diamond.

After the reflective film has thus been disposed around the side surfaces and the first main surface of the light emitting element, the electrodes on the first main surface side of the light emitting element are exposed from the reflective film, so that the side surfaces of the light emitting element can be reliably covered by the reflective film. This allows a light emitting device that has a reflective film on the side surfaces of the light emitting element, and in which the electrodes of the light emitting element are exposed on the lower surface side, to be formed with ease. Consequently, light emitted on the side surface side and the first main surface side of the light emitting element can be efficiently reflected, and light extraction can be efficiently performed toward the second main surface side of the light emitting element. Also, even when a conductive material is used as the reflective film, the reflective film can be effectively separated from the electrodes, and there will be little risk of electrical short circuiting.

Furthermore, the side surfaces of the light emitting element can be effectively covered with the reflective film by a simple method in which a reflective film is prepared and disposed on the light emitting element side surfaces, and the electrodes are exposed from the reflective film. This can simplify the manufacturing process, allow for simpler manufacturing equipment, and reduce the manufacturing cost.

e: Formation of Light-Transmissive Member 19

After the exposure of the electrodes of the light emitting element from the reflective film, the light-transmissive member 19 may be provided to the second main surface side of the light emitting element, which is on the opposite side from the first main surface.

As discussed above, when a second support member is used, a light-transmissive member can be provided after this support member is removed from the first main surface of the light emitting element. When a wavelength conversion sheet or plate is used as the second support member, it can be used as the light-transmissive member, without being removed.

The light-transmissive member can be formed by coating, spraying, spin coating, printing, the bonding of a sheet-form member, or another such method.

The light-transmissive member can be formed from the same material as that used for the above-mentioned adhesive agent. The light-transmissive member may be formed from a light-transmissive material alone, or it may also contain a phosphor, a filler, or the like.

When emission efficiency and color adjustment are taken into account, the light-transmissive member preferably has a particle size of 10 to 500 µm, and more preferably 50 to 300 µm.

One light-transmissive member may be installed for one light emitting element, or one light-transmissive member may be installed for a plurality of light emitting elements. In the latter case, the dividing of the reflective film discussed below is preferably utilized to separate the light-transmissive member as well. This allows one light-transmissive member to be disposed by a simple method for one or more light emitting elements.

The thickness and so forth of the light-transmissive member here can be suitably adjusted according to the material being used and other such factors. The light-transmissive member can be fixed with an adhesive agent to the second main surface side of the light emitting element. Or, the adhesion of the light-transmissive member itself may be used for fixing. The adhesive agent used here is preferably as light-transmissive as the above-mentioned light-transmissive member.

The light-transmissive member 19 may be provided on the second main surface side of the light emitting element, which is the opposite side from the first main surface, before the electrodes of the light emitting element are exposed from the reflective film. For example, the light-transmissive member is formed on a sapphire substrate 11 of the light emitting element 14 prior to the disposition of the reflective film 15 on the light emitting element 14. This allows the reflective film 15 to be disposed on the side surfaces of the light-transmissive member as well. Since light extraction from the side surfaces of the light-transmissive member can be blocked by the reflective film, this can enhance the directionality of the emission from the light emitting device.

The light-transmissive member may have a laminated structure having a layer containing a wavelength conversion member and a layer composed of just a light-transmissive material, or it may have a structure in which a layer containing a wavelength conversion member and a layer including a portion that does not contain this member or a portion in which the concentration of the wavelength conversion member is low are laminated.

f: Separating of Reflective Film 15

Furthermore, the reflective film 15 may be separated into light emitting element groups including one or more light emitting elements. In other words, at least one light emitting device (e.g., unit) each having at least one light emitting element is formed by separating, dividing or cutting the reflective film 15. In particular, referring to FIGS. 2E and 2F, one light emitting device 10D including one light emitting element 14 is formed by cutting the reflective film 15. Also, referring to FIGS. 5D and 5E, a plurality of light emitting devices 30 each including one light emitting element 14 are formed by cutting the reflective film 15. This step may be performed before the above-mentioned step (d), but when manufacturing efficiency and the like are taken into account, it is preferably performed afterward. Also, it may be performed either before or after step (e), but in the case that a light-transmissive member is disposed for each individual light emitting element, then it is preferably performed after step (e).

The separating of the reflective film is accomplished, for example, by cutting around the outer periphery of one light emitting element. This cutting can be done by any method, such as blade dicing, laser dicing, or the use of a cutting die or the like.

The cutting may be performed from the first main surface side of the light emitting element, or from the second main surface side. Also, it may be performed from both the first main surface side and the second main surface side.

For example, when cutting from the second main surface side, a groove may be formed ahead of time in the support member on the first main surface side of the light emitting element. This allows the groove formed from the first main surface side to pass through and the reflective film to be separated by light emitting elements or by light emitting element groups, by cutting by the above-mentioned method or by blasting, machining, grinding, etc., so as to reduce the thickness overall from the second main surface side of the light emitting element. The reflective film and the support member can be separated in a single step, allowing a light emitting device comprising not just a reflective film, but also a support component, to be manufactured simply.

A member other than the product of separating the support member that supports the reflective film in the above-mentioned pressing of the reflective film may be used as the support component of the light emitting device. For example, a support component may be provided on the outside of the reflective film in between any of the above-mentioned steps (a) to (f). This support component formation step is preferably performed after step (c) and before step (d), for example. The light emitting device can be easily manufactured by removing the support component in step (d). Also, in the case that the support component is formed after step (d), it can be formed by covering the electrodes of the light emitting element exposed in step (d) with a third support member such as a pressure-sensitive adhesive sheet, and then filling in the space between the third support member and the reflective film with the material of the support component.

The support component can be formed by spraying, coating, transfer molding, printing, or another such method. The material of the support component can, for example, be the same as that of the above-mentioned adhesive agent or support member. With the light emitting device in this embodiment, since the reflective film is present between the support component and the light emitting element, light emitted from the light emitting element may not shine directly on the support component. Therefore, the material of the support component can be one whose light resistance is relatively low.

Embodiment 1

The light emitting device 10 manufactured by the method for manufacturing a light emitting device in Embodiment 1 has the light emitting element 14 and the reflective film 15, as shown in FIGS. 1A and 1B.

The light emitting element 14 has a semiconductor stacked layer 12 that is formed on a Tight-transmissive sapphire substrate 11, and a pair of electrodes 13 on the first main surface 14a thereof. The pair of electrodes 13 in this embodiment may include a first conductive type-side electrode that is in contact with a first conductive type semiconductor layer of the semiconductor stacked layer, a second conductive type-side electrode that is in contact with a second conductive type semiconductor layer, and a pair of copper electrode posts 13a that extend to the opposite side from the semiconductor stacked layer 12 and are respectively connected to the first conductive type-side electrode and the second conductive type-side electrode. An adhesive agent 18 is disposed between the electrodes 13.

The light emitting element 14 is covered substantially all the way around its side surfaces by a reflective film 15 composed of aluminum and having a thickness of 30 μm. The reflective film 15 is fixed by the adhesive agent 18 to the side surfaces of the light emitting element 14.

With this light emitting device, the thickness of the reflective material provided to the side surfaces of the light emitting element can be reduced because of the simple configuration in which a reflective film in the form of a thin-film is formed on the side surfaces of the light emitting element, so the light emitting device can be made compact. Also, leakage of light from the side surfaces of the light emitting element can be reduced, which affords a light emitting device with better directionality.

A light emitting device such as this can be manufactured by the following method.

First, as shown in FIG. 2A, the reflective film 15 is provided. Also the light emitting element 14, which has the semiconductor stacked layer 12 that is formed on the sapphire substrate 11, and the pair of electrodes 13, which may include the electrode posts 13a formed on the first main surface 14a side is provided.

The adhesive agent 18, which is in an uncured (that is, liquid) state, is disposed in the region of the reflective film 15 that is opposite the first main surface 14a of the light emitting element 14. This adhesive agent 18 is a material that is light-transmissive at least in its cured state.

Then, as shown in FIG. 2B, the reflective film 15 is pressed to the light emitting element 14 on the first main surface 14a side of the light emitting element 14. This deforms the reflective film 15, and disposes the reflective film 15 continuously over the entire first main surface 14a side of the light emitting element 14 and the side surfaces of the light emitting element 14, for example. This pressing causes the liquid adhesive agent 18 to be disposed between the electrodes 13, between the electrodes 13 and the reflective film 15, and between the reflective film 15 and the side surfaces of the light emitting element 14. After this the adhesive agent 18 is cured.

In the pressing of the reflective film 15 to the light emitting element 14, the distance between the side surfaces of the light emitting element and the reflective film 15 may be varied in the thickness direction of the light emitting element 14 so that the reflective film spreads out from the first main surface 14a side to the second main surface side. As shown in FIG. 1C, this allows an inclined surface to be set for the reflective film 15. With this arrangement, the extraction of light from the side surfaces of the light emitting element and the light extraction efficiency of the light emitting device can be enhanced.

As shown in FIG. 2C, the electrode posts 13a of the light emitting element 14 are exposed from the reflective film 15. The exposure here involves the use of a cutting device, which cuts down to the broken line X in substantially the same plane as the end surface of the electrode posts 13a from the first main surface 14a side of the light emitting element 14, and the reflective film 15 and the adhesive agent 18 disposed on the first main surface 14a of the light emitting element 14 are removed to expose the surface of the electrode posts 13a. In this case, the reflective film 15 is affixed to the light emitting element 14 by the adhesive agent 18, and independence with respect to the cutting is imparted between the pair of electrodes 13 and between the electrodes 13 and the reflective film 15, allowing the cutting to be carried out reliably and accurately. Also, the adhesive agent 18 allows the reflective film 15 and the electrode posts 13a or the electrodes 13 to be reliably isolated.

The reflective film can be reliably disposed on the side surfaces of the light emitting element by a simple process that merely involves preparing the light emitting element and the reflective film. Consequently, light leakage to the sides of the light emitting element can be reduced by a simple method, and light emitting devices 10 and 10A with high directionality can be easily manufactured.

Modification Example 1

After the electrode posts 13a of the light emitting element 14 have been exposed from the reflective film 15 as shown in FIG. 2C, the light-transmissive member 19 is formed on the second main surface side of the light emitting element 14, which is the opposite side from the first main surface, as shown in FIG. 2D. The light-transmissive member 19 is formed by bonding a sheet-form member with an adhesive or the like.

After this, the light-transmissive member 19 is separated along with the reflective film 15 by blade dicing into single light emitting elements as shown in FIG. 2E.

Figure 2F:
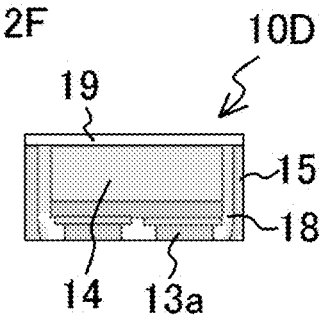

As shown in FIG. 2F, the manufacturing method in this modification example allows a light emitting device 10D equipped with the light-transmissive member 19 to be manufactured simply.

Modification Example 2

After the electrodes 13 of the light emitting element 14 are exposed from the reflective film 15, metal films 13b that are larger than the electrodes 13 may be formed on the surface of each of the electrodes 13 of the light emitting element 14 as shown in FIG. 1D or 1E. This allows for easier mounting of the light emitting devices 10B and 10C.

Embodiment 2

Figure 3A:
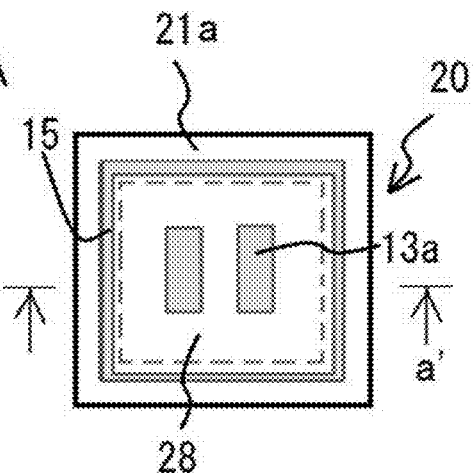
FIG. 3A is a schematic bottom view of the light emitting device according to an embodiment of the present disclosure.
Figure 3B:
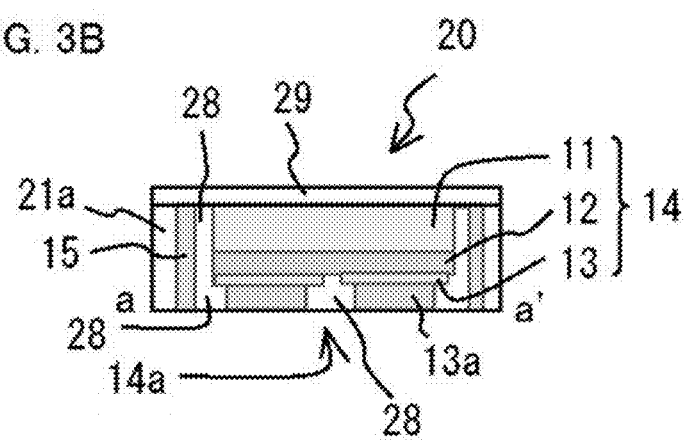
FIG. 3B is a schematic cross section along the a-a' line in FIG. 3A.

As shown in FIGS. 3A and 3B, the light emitting device 20 manufactured by the method for manufacturing a light emitting device in Embodiment 2 has similar configuration to the light emitting device 10 in Embodiment 1, except that it includes a support component 21a that surrounds the light emitting element 14 and the reflective film 15, and a light-transmissive member 29 that is disposed on the light emitting element 14, is composed of glass, and contain a YAG phosphor.

This light emitting device 20 includes the light emitting element 14, the reflective film 15, the support component 21a, and the light-transmissive member 29.

The support component 21a is formed from a silicone resin, for example. The support component 21a is disposed so as to surround the reflective film 15 in a width of about 5 to 500 µm, for example.

With this light emitting device 20, a resin composed of a silicone resin containing 50 wt % titanium dioxide is used as an adhesive agent 28. Accordingly, the area between the electrodes 13 and the area between the electrodes 13 and the reflective film 15 are covered by the adhesive agent 28, which is reflective.

This light emitting device has substantially the same effect as the light emitting device in Embodiment 1. Also, since the support component protects the light emitting element and the reflective film, the strength of the light emitting device can be increased. Also, since light emitted on the electrode side is reflected by the reflective adhesive agent, the light extraction efficiency can be improved. Furthermore, light emitted from the light emitting element can be subjected to wavelength conversion.

This light emitting device can be manufactured by the following method.

Figure 4A:
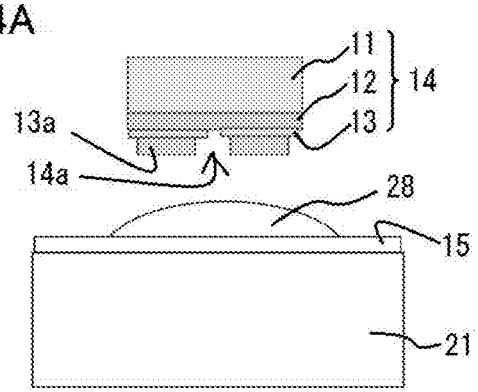
FIGS. 4A to 4E show the manufacturing steps involved in the method for manufacturing a light emitting device according to another embodiment of the present disclosure.

As shown in FIG. 4A, the reflective film 15 that is disposed on the support member 21, which is made from a material that can be deformed by pressing discussed below, such as a semi-cured silicone resin is provided. The light emitting element 14 is also provided which has the semiconductor stacked layer 12 on the sapphire substrate 11, and the electrodes 13 formed on the first main surface 14a side.

The adhesive agent 28, which is a liquid silicone resin containing titanium dioxide, is disposed in the region of the reflective film 15 that is opposite the first main surface 14a of the light emitting element 14.

Figure 4B:
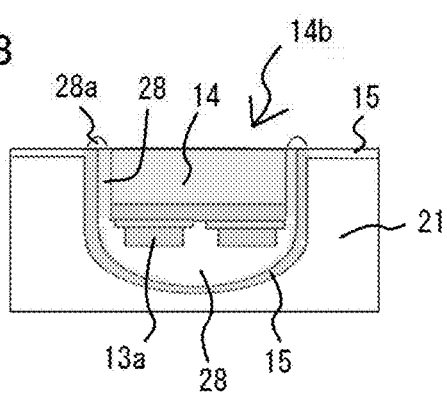

Next, as shown in FIG. 4B, a die-bonder is used to press the light emitting element 14 from the second main surface 14b side, which is on the opposite side from the first main surface 14a, and embed the light emitting element 14 along with the reflective film 15 in the support member 21. This deforms the reflective film 15, and disposes the reflective film 15 over the entire first main surface 14a of the light emitting element 14 and the side surfaces of the light emitting element 14. Also, the support member 21 deforms and is disposed around the outside of the reflective film 15 to provide a snug fit. The pressing to the support component 21 here may result in an excess portion 28a of the adhesive agent 28 disposed between the light emitting element 14 and the reflective film 15 leaking out to the support component 21. After this, the adhesive agent 28 and the support component 21 are subjected to final curing.

Figure 4C:
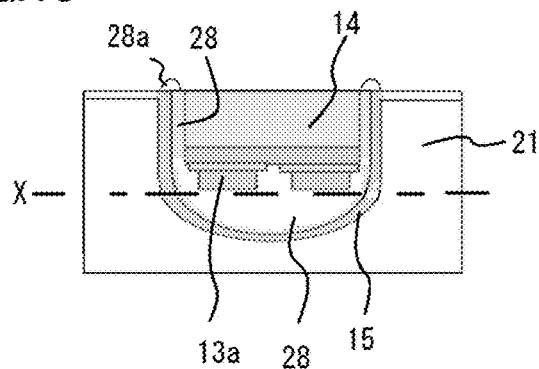

Next, as shown in FIG. 4C, the electrode posts 13a of the light emitting element 14 are exposed from the reflective film 15. Using a cutting device, the reflective film 15 and the adhesive agent 28 are cut down to the broken line X, which lies in substantially the same plane as the end surfaces of the electrode posts 13a, from the first main surface 14a side of the light emitting element 14, thereby exposing the electrode posts 13a from the reflective film 15 and the adhesive agent 28.

Figure 4D:
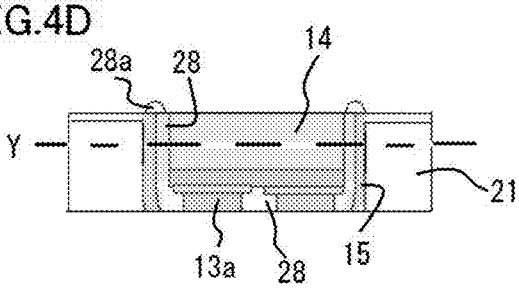

Then, as shown in FIG. 4D, a machinery device is used on the second main surface 14b side of the light emitting element 14 to cut/polish the sapphire substrate 11, the reflective film 15, and the support component 21 down to the location of the broken line Y in FIG. 4D, so as to reduce the thickness of the sapphire substrate 11. This cutting/polishing allows the excess portion 28a of the adhesive agent 28 to be removed. Also, thin sapphire substrate 11 constituting the light emitting element 14 can be obtained. Therefore, light absorption by the sapphire substrate 11 or by the excess portion 28a of the adhesive agent 28 is reduced, and the light extraction efficiency of the light emitting device can be improved.

Figure 4E:
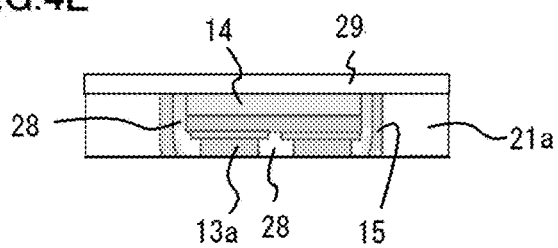

After this, as shown in FIG. 4E, the light-transmissive member 29 is bonded over the cut second main surface 14b of the light emitting element 14. In this embodiment, the light-transmissive member 29 is a glass sheet containing 20 wt % YAG phosphor. The light-transmissive member 29 is fixed by a light-transmissive adhesive agent.

Thus, as discussed above, a reflective film can be reliably disposed on the side surfaces of the light emitting element by a simple process involving only the preparation of the light emitting element and the reflective film.

Also, in this embodiment, the light emitting device can be made thinner by removing a part of the growth substrate of the semiconductor stacked layer of the light emitting element. Also, the light emitting device can be reinforced by the support component, and because a member that reflects light is disposed on the side surfaces and the bottom surface of the light emitting device, the directionality of the light emitted from the light emitting device can be improved and the strength of the light emitting device can be increased, both by a simple manufacturing method.

Modification Example 3

Figure 3C:
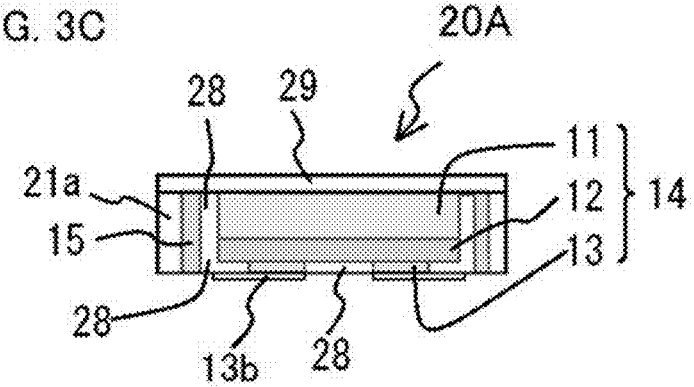
FIG. 3C is a schematic cross section of a modification example of FIG. 3B.

For instance, the light emitting element 14 has the pair of electrodes 13 but not the electrode posts 13a, then after the electrodes 13 of the light emitting element 14 are exposed from the reflective film 15, metal films 13b that are larger than the electrodes 13 may be formed on the surface of each of the electrodes 13 of the light emitting element 14 as shown in FIG. 3C. This allows for easier mounting of the light emitting device 20A.

Embodiment 3

Figure 5A:
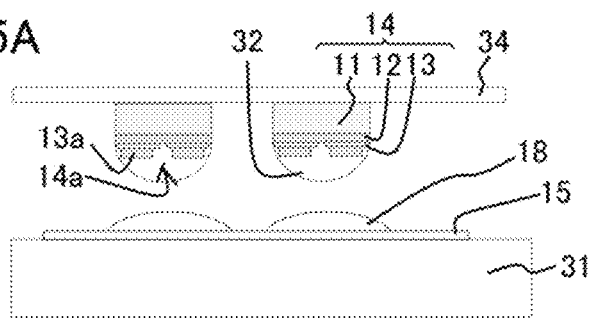
FIGS. 5A to 5E show the manufacturing steps involved in the method for manufacturing a light emitting device according to still another embodiment of the present disclosure.

With the method for manufacturing a light emitting device 30 in Embodiment 3, the first thing, as shown in FIG. 5A, is to provide a reflective film 15 composed of silver and disposed on a support member 31, which is a protective sheet composed of resin.

A plurality of light emitting elements 14 are provided, each having the semiconductor stacked layer 12 on the sapphire substrate 11, and the electrodes 13 formed on the first main surface 14a side. A light reflecting member 32, which is a silicone resin containing 30 wt % titanium dioxide as a light reflecting material, for example, is formed on the first main surface 14a side of each of these light emitting elements 14. The light reflecting members 32 here are disposed so as to completely embed the electrodes 13, including the electrode posts 13a. As shown in FIG. 5A, the light reflecting members 32 are formed in round shape at the distal end and comes into contact with the reflective film 15 during pressing in the next step, which makes it less likely that breakage will occur in the pressing of the reflective film 15.

The light emitting elements 14 are disposed so as to be spaced apart on the second support member 34, for example, and are bonded.

The liquid adhesive agent 18 is disposed in the region of the reflective film 15 that is opposite the first main surface 14a of the light emitting element 14. This adhesive agent 18 is light-transmissive at least after curing.

Figure 5B:
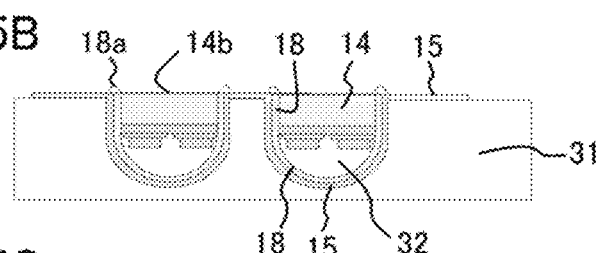

The light emitting elements 14 are pressed by a die-bonder from the second support member 34 side, with the second support member 34 in between, and as shown in FIG. 5B, the light emitting elements 14 are embedded along with the reflective film 15 in the support member 31. This deforms the reflective film 15, and disposes the reflective film 15 over the entire light reflecting members 32 covering the electrodes 13 of the light emitting elements 14 and the side surfaces of the light emitting elements 14, with the support member 31 being disposed in close contact around the outside of these. The pressing with the support member 31 may cause the surplus portion 18a of the adhesive agent 18 disposed between the reflective film 15 and the light emitting elements 14 to leak out to the support member 31 side.

The second support member 34 may be affixed directly to the light emitting elements 14, but is peeled off after pressing.

Figure 5C:
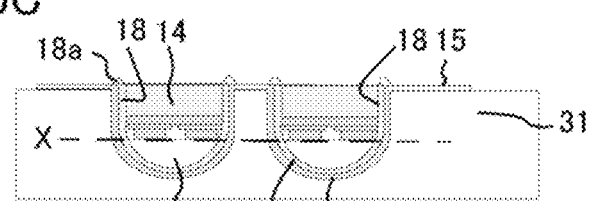

The electrode posts 13a of the electrodes 13 of the light emitting elements 14 are exposed from the reflective film 15 as shown in FIG. 5C. The exposure here is accomplished by using a cutting device to cut down to the broken line X from the first main surface 14a side of the light emitting elements 14 to expose the surface of the electrode posts 13a. In this case, because the adhesive agent 18 and the support member 31 are cured properly, the reflective film 15 is securely attached to the light emitting elements 14. Also, because the light reflecting members 32 made of resin cover the space between the electrodes 13, independence with respect to the cutting is imparted between the electrodes 13 and between the electrodes 13 and the reflective film 15, which allows the cutting to be performed reliably and accurately. Furthermore, the light reflecting members 32 can effectively isolate the electrodes 13 or the electrode posts 13a from the electrodes 13, both electrically and physically.

Figure 5D:
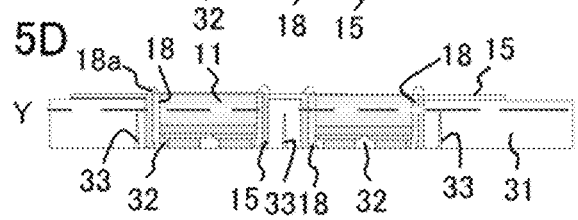
Figure 5E:
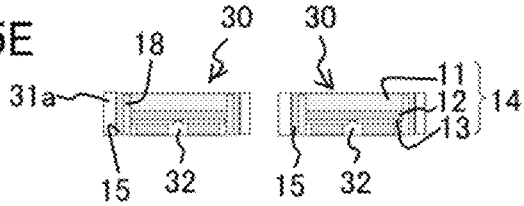

As shown in FIG. 5D, grooves 33 are formed with a dicing saw, a blade, or the like in the support member 31 between the light emitting elements 14, from the first main surface 14a side of the light emitting elements 14. These grooves 33 are formed so as to maintain the reflective film 15 on the second main surface 14b side of the light emitting elements, and leave a portion in the thickness direction of the support member. This allows the subsequent steps to be performed while the light emitting elements 14 are held together integrally, so the light emitting devices can be manufactured more efficiently. The depth of the grooves 33 can be set to about 0.3 to 0.9 times the thickness of the support member, for example.

Next, the adhesive agent 18, the reflective film 15, the sapphire substrates 11 of the light emitting elements 14, and the support member 31 are cut down to the broken line Y, that is, to the bottom surfaces of the grooves 33 formed in the prior step, using a cutting device from the second main surface 14b side of the light emitting elements 14. This allows division into individual light emitting elements 14 in a state in which the support components 31a are disposed around the outside. Also, the surplus portion 18a of the adhesive agent can be removed, and the sapphire substrates 11 constituting the light emitting elements 14 can be thin. Therefore, light absorption attributable to them can be reduced.

Thus, a reflective film can be reliably disposed on the side surfaces of the light emitting elements by a simple process, in the same manner as above.

Also, in this embodiment, a part of the growth substrate of the semiconductor stacked layer of the light emitting elements can be removed to reduce the thickness, while the product can be reinforced by the support components 31a, which allows the strength of the light emitting device to be improved and the directionality of the light emission to be increased, both by a simple manufacturing method.

Embodiment 4

Figure 6A:
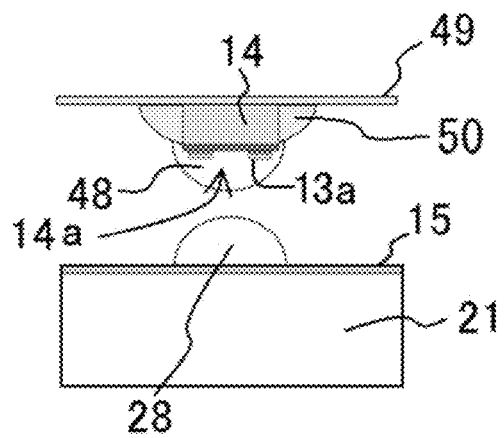
FIGS. 6A to 6C show the manufacturing steps involved in the method for manufacturing a light emitting device according to still another embodiment of the present disclosure.

As shown in FIG. 6A, with the method for manufacturing a light emitting device 40 in Embodiment 4, a reflective film 15 and a light emitting element 14 are disposed on a support member 21.

As in FIG. 5A, a protective member 48, which is a silicone resin containing 30 wt % titanium oxide as a light reflecting material, for example, is disposed on the first main surface 14a side of the light emitting element 14. Also, a second light-transmissive member 50 is disposed so as to cover substantially the entire side surfaces of the light emitting element 14. A light-transmissive member 49 is bonded by an adhesive agent on the opposite side of the light emitting element 14 from the first main surface 14a. Providing the second light-transmissive member 50 allows light to be efficiently extracted from the side surfaces of the light emitting element 14.

A liquid state adhesive agent 28 that is light-transmissive after curing is disposed in the region of the reflective film 15 that is opposite the first main surface 14a of the light emitting element 14.

Figure 6B:
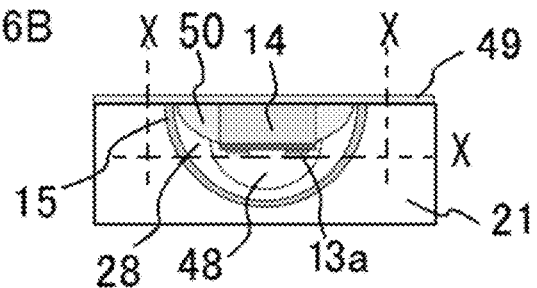

This light emitting element 14 is embedded with the reflective film 15 in the support member 21 as shown in FIG. 6B by using a die-bonder to press the light emitting element 14. This deforms the reflective film 15 and disposes the reflective film 15, via the adhesive agent 28, in part of the region on the outer surface of the protective member 48 that covers the electrodes 13 and the light emitting element 14, and the side surfaces of the light emitting element 14 (that is, the side surfaces of the second light-transmissive member 50). The support member 21 is disposed around the outside of these to provide a snug fit.

Figure 6C:
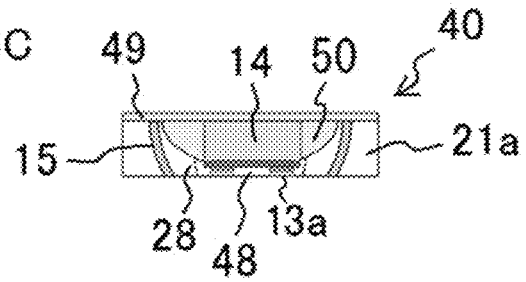

After this, the electrode posts 13a on the electrodes of the light emitting element 14 are exposed from the reflective film 15 as shown in FIG. 6C, along the X line in FIG. 6B.

This exposure can be performed by cutting or the like, in the same manner as in Embodiment 3.

Thus, a reflective film can be reliably disposed on the side surfaces of the light emitting elements by a simple process, in substantially the same manner as above.

Embodiment 5

Figure 7A:
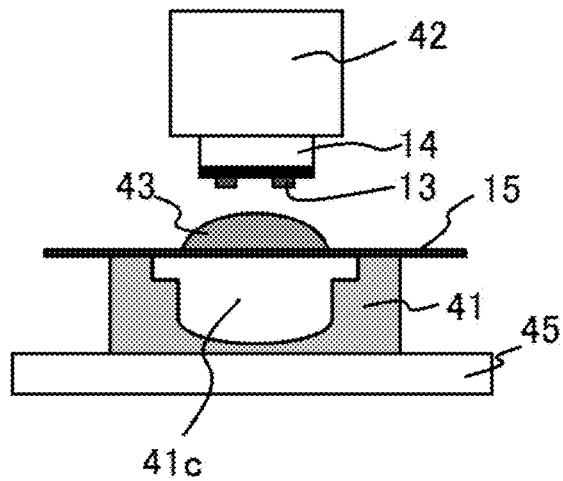
FIGS. 7A to 7E show the manufacturing steps involved in the method for manufacturing a light emitting device according to still another embodiment of the present disclosure.

As shown in FIG. 7A, with the method for manufacturing a light emitting device 60 in Embodiment 5, first a support member 41 having a recess 41c equipped with a step on the side surface is prepared. This step preferably matches the size of the die-bonder 42 being used. This step is set, in top view, such that the inner surface of the recess is greater at the top of the step which is the side close to the opening of the recess, and is smaller at the lower side of the step. The size of the collet 42 of the die bonder is preferably smaller than the outer shape of the upper portion of the step of the inner surface of the recess in a top view, and is preferably larger than the outer shape of the lower portion. This makes it possible to block the portion of the stepped recess by the collet 42 of the die bonder, it is possible to reduce the leakage of the adhesive agent 43. In the case that the adhesive agent 43 is made from a material that is cured by heat, the support member 41 is preferably disposed on a mounting supporting portion 45 equipped with a heating component. The reflective film 15 is disposed on this support member 41, and an adhesive agent 43 is applied over this. This adhesive agent 43 may contain a light reflecting material, or may be one which is light-transmissive.

Next, a light emitting element 14 equipped with a pair of electrodes 13 is prepared and placed in the collet 42 of the die-bonder. The size of the tip of the die bonder of the collet 42 in the present embodiment, slightly larger than that of the light-emitting element 14 in a top view.

Figure 7B:
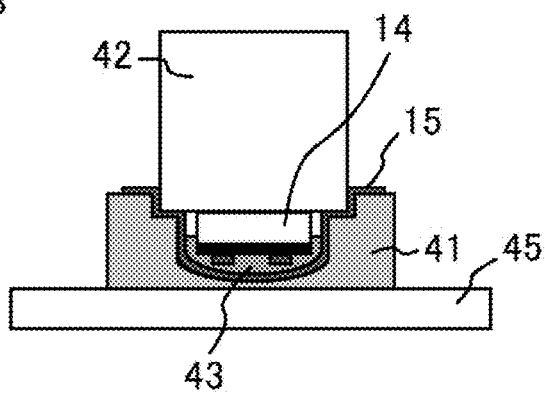

As shown in FIG. 7B, the light emitting element 14 is pressed by the collet 42 of the die-bonder to the support member 41, which embeds the light emitting element 14 with the reflective film 15 in the recess 41c of the support member 41. The collet 42 of the die-bonder also deforms the reflective film 15 along the step of the support member 41. Consequently, the side surfaces of the light emitting element 14, the electrodes 13 of the light emitting element 14, and the step and the recess of the support member 41 can be covered by the reflective film 15. It is preferable here to heat the support member 41 with the mounting support portion 45 so that the adhesive agent 43 will be cured in its pressed shape.

Figure 7C:
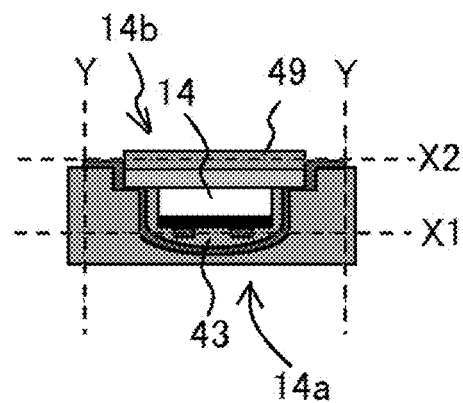

As shown in FIG. 7C, a light-transmissive member 44 composed of a laminated structure of a light-transmissive layer and a wavelength conversion layer, from the side closer to the light emitting element 14, is disposed at the step of the support member 41 covered by the reflective film 15. Thus, the side surface of the light transmissive member 44 is covered with the reflective film 15 and the support member 41. After this, a cutting device is used to expose the electrodes 13 of the light emitting element 14 from the reflective film 15 along the broken line X1, and to cut part of the light-transmissive layer of the light-transmissive member 44 and part of the support member 41 along the broken line X2.

Figure 7D:
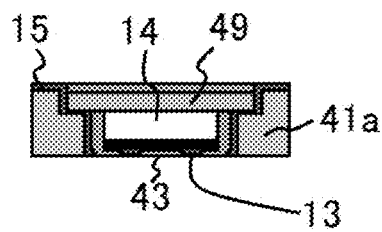
Figure 7E:
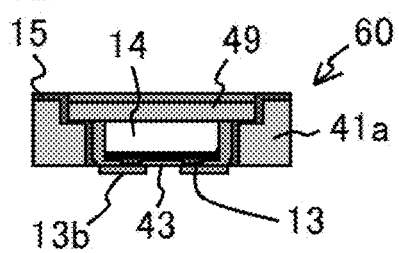

Grooves are formed with a dicing saw, a blade, or the like in the support member 41 from the first main surface 14a side of the light emitting element 14, and the support member 41 is cut along the grooves with a cutting device from the second main surface 14b side of the light emitting element 14 to the bottom surface of the grooves (the broken line Y). As shown in FIG. 7D, this allows division into light emitting elements 14 in a state in which a support component 41*a* is disposed around the outside.

After this, metal films 13*b* that are larger than the electrodes 13 are formed on the surface of the electrodes 13 of the light emitting element 14 exposed from the reflective film 15. This allows the light emitting device 60 shown in FIG. 7E to be manufactured.

In the case that a plurality of light emitting elements are installed on a support member having a plurality of recesses, under the condition that a plurality of light emitting elements attach into a sheet, the plurality of light emitting elements is faced to the support member, after this, the plurality of light emitting elements may be provided on the support member integrally by pressing a jig from the sheet side.

Thus, just as discussed above, a reflective film can be reliably disposed on the side surfaces of the light emitting element by a simple process involving. The reflective film can also be disposed on the side surfaces of the light-transmissive member, so a light emitting device with good upward light distribution can be manufactured simply. The light-emitting device with good contrast of the light-emitting portion and the non-emitting portion can be produced.

The method for producing the light emitting element according to the present disclosure can be suitably employed for producing various lighting apparatuses, in particular, a light source for lighting, an LED display, backlight source for a liquid crystal display device, signals, a lighted switch, various sensors, various indicators, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method for manufacturing a light emitting device, the method comprising:
   providing a reflective film having a flat upper surface;
   providing at least one light emitting element having a semiconductor stacked layer and a pair of electrodes formed at a first main surface side of the light emitting element, the first main surface side being opposite from a light extraction side of the light emitting element;
   applying an adhesive agent on the flat upper surface of the reflective film with an upper surface of the adhesive agent defining a convex shape, and arranging the light emitting element so that the electrodes on the first main surface side of the light emitting element face the upper surface of the adhesive agent;
   pressing the adhesive agent and the reflective film by the electrodes on the first main surface side from the upper surface of the adhesive agent to deform the adhesive agent and the reflective film so that the adhesive agent and the reflective film define a convex shape protruding downwardly, and disposing the reflective film to cover at least a side surface of the light emitting element adjacent to the first main surface side, with the adhesive agent being disposed between the side surface of the light emitting element and the reflective film after the reflective film is deformed; and
   removing a portion of the reflective film and a portion of the adhesive agent so that surfaces of the electrodes on a side opposite from the light extraction side of the light emitting element are exposed while the side surface of the light emitting element remains covered by the reflective film after the removing of the portion of the reflective film and the portion of the adhesive agent.

2. The method according to claim 1, wherein the removing of the portion of the reflective film includes removing the portion disposed in a region that has been deformed at the first main surface side of the light emitting element.

3. The method according to claim 1, further comprising forming a light-transmissive member at a second main surface side of the light emitting element, the second main surface side being opposite the first main surface side.

4. The method according to claim 1, further comprising separating the reflective film to form a plurality of units each including the light emitting element.

5. The method according to claim 1, further comprising providing a support member that is formed from a material configured to maintain deformation resulting from the pressing or that has a recess, and
   disposing the reflective film on the support member.

6. The method according to claim 5, further comprising separating the support member.

7. The method according to claim 1, wherein the providing of the light emitting element includes providing a plurality of the light emitting elements that are disposed on a second support member, and
   all of the light emitting elements are pressed at once to the reflective film.

8. The method according to claim 1, wherein the reflective film is disposed at the side surface of the light emitting element and the adhesive agent is disposed between the electrodes after the reflective film is deformed.

9. A method for manufacturing a light emitting device, the method comprising:
   providing a reflective film having a flat upper surface;
   providing at least one light emitting element having a semiconductor stacked layer and a pair of electrodes formed at a first main surface side of the light emitting element, the first main surface side being opposite from a light extraction side of the light emitting element;
   applying an adhesive agent on the flat upper surface of the reflective film with an upper surface of the adhesive agent defining a convex shape, and arranging the light emitting element so that the electrodes on the first main surface side of the light emitting element face the upper surface of the adhesive agent;
   pressing the adhesive agent and the reflective film by the electrodes on the first main surface side from the upper surface of the adhesive agent to deform the adhesive agent and the reflective film so that the adhesive agent and the reflective film define a convex shape protruding downwardly, and disposing the reflective film to cover at least a side surface of the light emitting element adjacent to the first main surface side, with the reflective film being disposed at the side surface of the light emitting element and the adhesive agent being disposed between the electrodes after the reflective film is deformed; and
   removing a portion of the reflective film and a portion of the adhesive agent so that surfaces of the electrodes on a side opposite from the light extraction side of the light emitting element are exposed while the side surface of the light emitting element remains covered by the reflective film after the removing of the portion of the reflective film and the portion of the adhesive agent.

10. The method according to claim 9, wherein the removing of the portion of the reflective film includes removing the portion disposed in a region that has been deformed at the first main surface side of the light emitting element.

11. The method according to claim 9, further comprising forming a light-transmissive member at a second main surface side of the light emitting element, the second main surface side being opposite the first main surface side.

12. The method according to claim 9, further comprising separating the reflective film to form a plurality of units each including the light emitting element.

13. The method according to claim 9, further comprising providing a support member that is formed from a material configured to maintain deformation resulting from the pressing or that has a recess, and
disposing the reflective film on the support member.

14. The method according to claim 13, further comprising separating the support member.

15. The method according to claim 9, wherein the providing of the light emitting element includes providing a plurality of the light emitting elements that are disposed on a second support member, and
all of the light emitting elements are pressed at once to the reflective film.

* * * * *